(12) United States Patent
Kim et al.

(10) Patent No.: US 8,124,497 B2
(45) Date of Patent: Feb. 28, 2012

(54) METHOD OF MANUFACTURING NITRIDE SEMICONDUCTOR DEVICE

(75) Inventors: Yong-Jin Kim, Gumi-si (KR); Dong-Kun Lee, Gumi-si (KR); Doo-Soo Kim, Gyeongbuk (KR); Ho-Jun Lee, Daegu (KR); Kye-Jin Lee, Gumi-si (KR)

(73) Assignee: Siltron, Inc., Gyeongbuk (KR)

( * ) Notice: Subject to any disclaimer, the term of this patent is extended or adjusted under 35 U.S.C. 154(b) by 0 days.

(21) Appl. No.: 12/955,222

(22) Filed: Nov. 29, 2010

(65) Prior Publication Data

US 2011/0129953 A1    Jun. 2, 2011

(30) Foreign Application Priority Data

Nov. 30, 2009   (KR) .................... 10-2009-0116614

(51) Int. Cl.
*H01L 21/762* (2006.01)
(52) U.S. Cl. .................... 438/458; 257/E21.22
(58) Field of Classification Search .................. 438/458; 257/E21.22
See application file for complete search history.

(56) References Cited

U.S. PATENT DOCUMENTS

| | | | |
|---|---|---|---|
| 6,287,891 B1 * | 9/2001 | Sayyah .................... 438/106 |
| 6,624,047 B1 * | 9/2003 | Sakaguchi et al. ............ 438/458 |
| 7,122,095 B2 * | 10/2006 | Letertre et al. ................ 156/344 |
| 7,422,958 B2 * | 9/2008 | Kostrzewa et al. ............ 438/406 |
| 2009/0218560 A1 * | 9/2009 | Flaim et al. ...................... 257/9 |
| 2011/0053347 A1 * | 3/2011 | Shimomura et al. .......... 438/458 |

FOREIGN PATENT DOCUMENTS

| | | |
|---|---|---|
| JP | 62-057223 A | 12/1987 |
| JP | 2009-270200 A | 11/2009 |
| KR | 1020050038581 A | 4/2005 |

* cited by examiner

*Primary Examiner* — W. David Coleman
(74) *Attorney, Agent, or Firm* — Lewis and Roca LLP (57) ABSTRACT

A method of manufacturing a nitride semiconductor device is disclosed. The method includes forming a gallium nitride (GaN) epitaxial layer on a first support substrate, forming a second support substrate on the GaN epitaxial layer, forming a passivation layer on a surface of the other region except for the first support substrate, etching the first support substrate by using the passivation layer as a mask, and removing the passivation layer and thereby exposing the second support substrate and the GaN epitaxial layer.

14 Claims, 5 Drawing Sheets

METHOD OF MANUFACTURING NITRIDE SEMICONDUCTOR DEVICE

CROSS-REFERENCE TO RELATED APPLICATION

This application claims the priority benefit of Korean application number 10-2009-0116614 filed Nov. 30, 2009, which is incorporated by reference.

BACKGROUND OF THE INVENTION

1. Field of the Invention

The present disclosure relates to a method of manufacturing a nitride semiconductor device.

2. Description of the Related Art

Gallium nitride (GaN) is a III-V compound semiconductor. A GaN compound semiconductor is used not only as an optical device such as a semiconductor laser and a light emitting diode (LED) operating in blue, green, and ultraviolet regions but also as a high temperature high output electronic device such as a high electron mobility transistor (HEMT) and a field effect transistor (FET) operating at a high temperature and a high output.

In general, when growing the GaN compound semiconductor to form a device, a hybrid substrate consisting of sapphire ($Al_2O_3$) or silicon carbide (SiC) is used. This is because it is difficult to commonly apply a bulk manufacturing method for a GaN substrate which requires high temperature and high pressure conditions in comparison with a melting method generally used for other semiconductors. Especially, a lattice constant and a thermal expansion coefficient of the $Al_2O_3$ substrate or the SiC substrate are largely different from those of GaN, which may cause a high defect density to a grown GaN crystal.

Such defects may reduce the efficiency in embodying the device and cause a leakage current. Accordingly, performance and yield of the device may be reduced. To this end, a high-quality single crystalline GaN substrate is demanded.

According to a commonly used method of manufacturing a single crystalline GaN substrate, a bulk GaN layer is grown on a hybrid substrate such as the $Al_2O_3$ substrate or the SiC substrate by a hydride vapor phase epitaxy (HVPE) method, and then the $Al_2O_3$ substrate or the SiC substrate is removed. Here, a laser lift-off process may be applied in removing a lower substrate such as the $Al_2O_3$ substrate or the SiC substrate. However, since the laser lift-off process generates high heat from a laser beam, the GaN substrate may be affected by the heat. In other words, the laser lift-off process may cause a stress between a nitride semiconductor layer and the lower substrate such as the $Al_2O_3$ substrate or the SiC substrate, thereby even breaking or damaging the GaN substrate.

In manufacturing a light emitting device such as an LED or a laser diode (LD), a hybrid substrate consisting of a different material from GaN, such as silicon, $Al_2O_3$, and SiC, is generally used. However, when a GaN-based material is grown on the hybrid substrate, defects such as a lattice mismatch or threading dislocation may occur in the grown thin film due to a difference in thermal expansion coefficients and a difference in crystalline lattice constants.

In a nitride semiconductor LED, $Al_2O_3$ is generally used for a substrate. Since the $Al_2O_3$ does not conduct an electric current, electrodes for supply of currents are laterally arranged. Here, part of light generated from an active layer escapes to the outside, thereby influencing the external quantum efficiency. However, actually, lots of light disappears in the form of heat, being shut in the $Al_2O_3$ substrate and the nitride semiconductor layer. In addition, since a current is applied in a lateral direction, imbalance of a current density occurs in the light emitting device, thereby deteriorating the performance of the device.

To this end, researches are underway to develop a technology for manufacturing a light emitting device where the $Al_2O_3$ substrate is removed and the electrodes have a vertical structure. Generally, a laser process may be used to remove the $Al_2O_3$ substrate. However, the laser process usually induces stress between the $Al_2O_3$ substrate and the nitride semiconductor that is the light emitting device. Therefore, the nitride semiconductor may be damaged.

SUMMARY OF THE CLAIMED INVENTION

Embodiments provide a method of manufacturing a nitride semiconductor device capable of growing a high-quality single crystalline GaN layer.

In one embodiment, a method of manufacturing a nitride semiconductor device includes forming a gallium nitride (GaN) epitaxial layer on a first support substrate, forming a second support substrate on the GaN epitaxial layer, forming a passivation layer on a surface of the other region except for the first support substrate, etching the first support substrate by using the passivation layer as a mask, and removing the passivation layer and thereby exposing the second support substrate and the GaN epitaxial layer.

In another embodiment, a method of manufacturing a nitride semiconductor device includes forming a light emitting structure on a support substrate, forming a second conductive layer on the light emitting structure, forming a passivation layer on surfaces of the light emitting structure and the second conductive layer except for a region of the support substrate, etching the support substrate by using the passivation layer as an etching mask such that one surface of the light emitting structure is exposed, and removing the passivation layer.

The details of one or more embodiments are set forth in the accompanying drawings and the description below. Other features will be apparent from the description and drawings, and from the claims. According to the embodiment, a high quality GaN layer can be achieved. Specifically, an epitaxial layer and a support part are formed on a hybrid substrate and then protected by a coating layer. Therefore, the hybrid substrate is selectively removed. Since the hybrid substrate is selectively removed by wet etching, damage of the epitaxial layer and the support part may be prevented. That is, damage of the device during removal of the hybrid substrate may be minimized.

A coating capable of protecting the support part from a wet etchant may be used for the coating layer so as to protect the epitaxial layer and the support part. Furthermore, the coating layer may be used by a large amount in a short time. Accordingly, economic efficiency and productivity may be increased. Additionally, by growing a GaN layer on the epitaxial layer from which the hybrid substrate is removed, crystallity of the GaN layer may be improved and electrical characteristics of the device may also be improved.

According to another embodiment, a vertical structure of the nitride light emitting device may be achieved. That is, since a light emitting structure and a support part are formed the hybrid substrate and then protected by a coating layer, the hybrid substrate may be selectively removed. According to this, the light emitting structure is able to have a vertical structure. Therefore, the electrical characteristics may be improved while uniform current density in the device is maintained.

Since damage of the light emitting structure is prevented by the coating layer, optical characteristics may be improved. The support part disposed at one side of the light emitting structure may perform handling of the light emitting structure during removal of the hybrid substrate. In addition, the support part may serve as an electrode of the light emitting structure after removal of the hybrid substrate. Therefore, a high-efficiency light emitting device may be achieved.

DETAILED DESCRIPTION

Reference will now be made in detail to the embodiments of the present disclosure, examples of which are illustrated in the accompanying drawings. In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings. In the drawings, the thickness or size of each layer is exaggerated, omitted, or schematically illustrated for convenience in description and clarity. Also, the size of each element does not entirely reflect an actual size.

First Embodiment

Hereinafter, a method of manufacturing a nitride semiconductor device according to the embodiment will be described with reference to FIG. 1 through 6.

Figure 1:
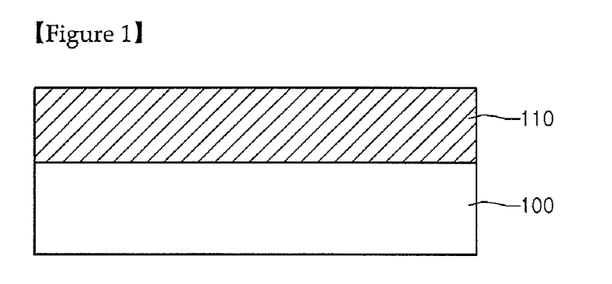
FIG. 1 illustrates the manufacturing process of a nitride semiconductor device according to an embodiment of the invention.

Referring to FIG. 1, a gallium nitride (GaN) epitaxial layer 110 is formed on a first support substrate 100. Any type of substrate may be adopted for the first support substrate 100 as long as being capable of forming the GaN epitaxial layer 110 thereon. For example, the first support substrate 100 may be any one of an oxide substrate and a carbide substrate, for example, sapphire ($Al_2O_3$) substrate, silicon (Si) substrate, and a silicon carbide (SiC) substrate.

The GaN epitaxial layer 110 may function as a buffer layer for a GaN semiconductor layer that will be formed later. That is, the GaN epitaxial layer 110 may be disposed between the first support substrate 100 and the GaN semiconductor layer to reduce the physical properties such as a lattice mismatch and a difference in thermal expansion coefficients. For example, the GaN epitaxial layer 110 may be formed by a metal organic chemical vapor deposition (MOCVD) process. The GaN epitaxial layer 110 may be formed to a thickness of about 2 to 8 μm. Therefore, when a single crystalline GaN layer is formed on any one surface of the GaN epitaxial layer 110, the thermal expansion coefficients and the crystalline lattice constants of the two layers are almost equalized. Accordingly, a high-quality GaN layer may be obtained.

Figure 2:
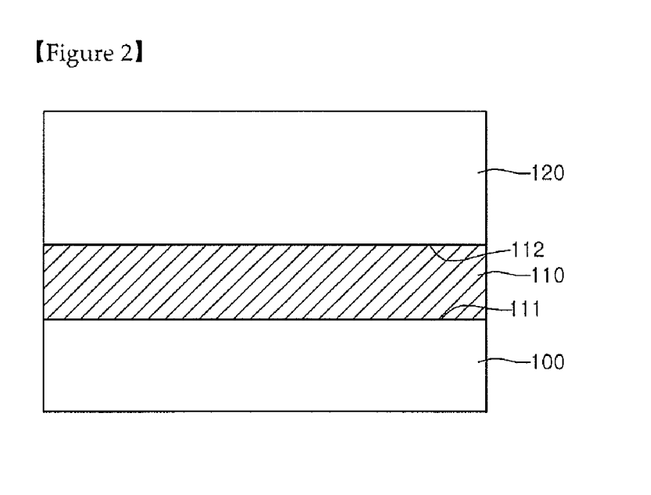
FIG. 2 illustrates the manufacturing process of a nitride semiconductor device according to an embodiment of the invention and that of FIG. 1.

Referring to FIG. 2, a second support substrate 120 is formed on the GaN epitaxial layer 110. The second support substrate 120 may be used as a handling wafer that controls layers disposed at a lower part thereof. Since the second support substrate 120 is formed to have a sufficient thickness to handle the GaN epitaxial layer 110. The second support substrate 120 may be about 10 to 50 times thicker than the GaN epitaxial layer 110. For example, the second support substrate 120 may have a thickness of about 50 to 100 μm.

The second support substrate 120 may be made of a conductive material such as metal. For example, the second support substrate 120 may be formed by electro-plating of any one of Cu, Pt, Au, Ni, and Al, or may be an alloy of them. The material of the second support substrate 120 is not limited to the conductive material. For example, the second support substrate 120 may be made of the same material as the first support substrate 100, that is, an oxide substrate or a carbide substrate. Accordingly, the GaN epitaxial layer 110 is disposed between the first support substrate 100 and the second support substrate 120. For example, any one surface of the GaN epitaxial layer 110 contacting the first support substrate 100 may be referred to as a first surface 111 while the other surface contacting the second support substrate 120 is referred to as a second surface 112.

Figure 3:
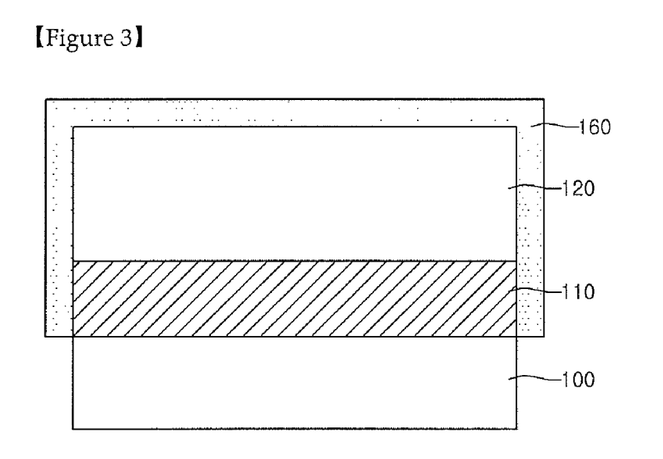
FIG. 3 illustrates the manufacturing process of a nitride semiconductor device according to an embodiment of the invention and that of FIGS. 1-2.

Referring to FIG. 3, a passivation layer 160 is formed on surfaces of the GaN epitaxial layer 110 and the second support substrate 120. The passivation layer 160 is adapted to protect the GaN epitaxial layer 110 and the second support substrate 120 from an etching process for removal of the first support substrate 100. The passivation layer 160 may be disposed on a surface of a region except for the first support substrate 100, that is, an exposed region of the GaN epitaxial layer 110 and the second support substrate 120. That is, the passivation layer 160 may be selectively disposed on a side surface of the GaN epitaxial layer 110 and a side surface and an upper surface of the second support substrate 120. For example, the passivation layer 160 may be formed of at least one of enamel, Teflon, paraffin, and polyester. The passivation layer 160 may be selectively disposed only on the exposed region of the GaN epitaxial layer 110 and the second support substrate 120 by spin coating or brush coating. Next, a curing process may be performed with respect to the passivation layer 160.

Figure 4:
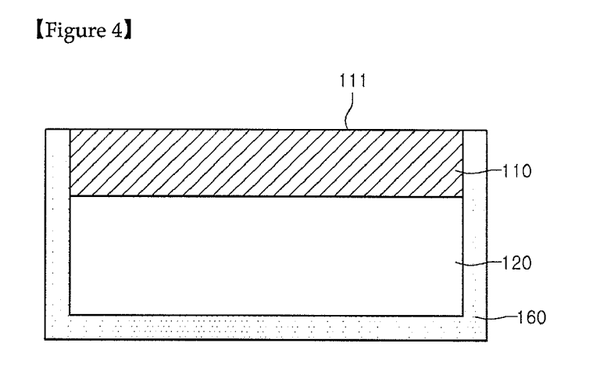
FIG. 4 illustrates the manufacturing process of a nitride semiconductor device according to an embodiment of the invention and that of FIGS. 1-3.

Referring to FIG. 4, the first support substrate 100 is removed and the first surface 111 of the GaN epitaxial layer 110 is exposed. Here, the first support substrate 100 may be removed by performing an etching process that uses the passivation layer 160 as an etching mask. Also, the first support substrate 100 may be removed by a wet etching process that uses a selective etchant. The wet etching may be performed until the first surface 111 of the GaN epitaxial layer 110 on the first support substrate 100 is exposed. The passivation layer 160 enables selective removal of the first support substrate 100 without damaging the second support substrate 120 and the GaN epitaxial layer 110. In addition, the first support substrate 100 may be rapidly removed from the GaN epitaxial layer 110 while preventing damage of the GaN epitaxial layer 110.

After removal of the first support substrate 100, the whole structure may be turned by about 180 degrees such that the second support substrate 120 is disposed at a lower part of the GaN epitaxial layer 110. Alternatively, the first support substrate 100, the GaN epitaxial layer 110, and the second support substrate 120 may be turned by about 180 degrees before the first support substrate 100 is removed, and then an etching process may be performed with respect to the first support substrate 100.

Figure 5:
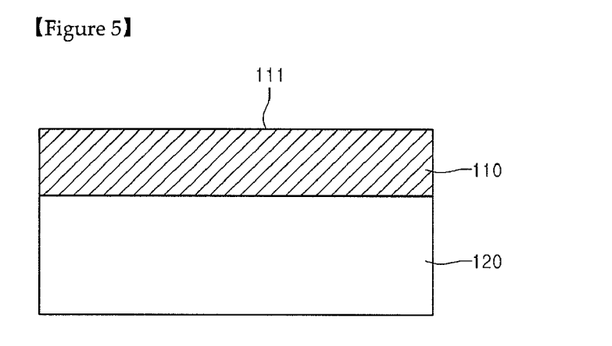
FIG. 5 illustrates the manufacturing process of a nitride semiconductor device according to an embodiment of the invention and that of FIGS. 1-4.

Referring to FIG. 5, the passivation layer 160 is removed and outer surfaces of the second support substrate 120 and the GaN epitaxial layer 110 are exposed. The passivation layer 160 may be removed by a coating removal process. For example, the passivation layer 160 may be removed by using an alcohol solvent such as methanol, acetone, and isopropyl alcohol (IPA). As a result, the GaN epitaxial layer 110 is disposed on the second support substrate 120. In addition, the first surface 111 of the GaN epitaxial layer 110 is disposed at an upper part in an exposed state. Accordingly, the GaN epitaxial layer 110 may be used as a substrate for growing a bulk GaN.

Figure 6:
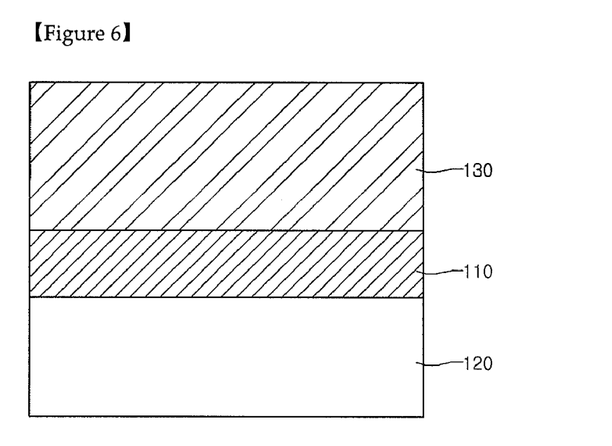
FIG. 6 illustrates the manufacturing process of a nitride semiconductor device according to an embodiment of the invention and that of FIGS. 1-5.

Referring to FIG. 6, a single crystalline GaN semiconductor layer 130 is formed on the first surface 111 of the GaN epitaxial layer 110. The GaN semiconductor layer 130 may be formed by a hydride vapor phase epitaxy (HVPE) process. Since the GaN semiconductor layer 130 is formed on the GaN epitaxial layer 110 having almost the same thermal expansion coefficient and crystalline lattice constant as the GaN semiconductor layer 130, a high-quality GaN layer may be obtained. On the other hand, the GaN epitaxial layer 110 from which the first support substrate 100 is removed has a relatively small thickness. Therefore, it may be difficult to handle the GaN epitaxial layer 110. To this end, according to the present embodiment, the second support substrate 120 is formed on the second surface 112 of the GaN epitaxial layer 110 so that handling of the GaN epitaxial layer 110 is facilitated.

The second support substrate 120 is made of a conductive metal and has a higher melting point than the GaN semiconductor layer 130. Therefore, the second support substrate 120 may be used as an electrode layer when the device is manufactured after growth of the GaN semiconductor layer 130. In addition, the GaN epitaxial layer 110 disposed on the second support substrate 120 may function as a growth buffer of the GaN semiconductor layer 130, thereby reducing defects of the device.

According to the present embodiment, after the first support substrate 100 disposed at the lower part of the GaN epitaxial layer 110 is selectively removed, the single crystalline GaN semiconductor layer 130 may be formed on the GaN epitaxial layer 110. As a result, a high-quality GaN semiconductor layer 130 may be obtained.

Second Embodiment

A method of manufacturing a nitride semiconductor device, according to another embodiment, will be described with reference to FIGS. 7 to 11. Especially, the present embodiment explains a method of manufacturing an LED using the nitride semiconductor.

Figure 7:
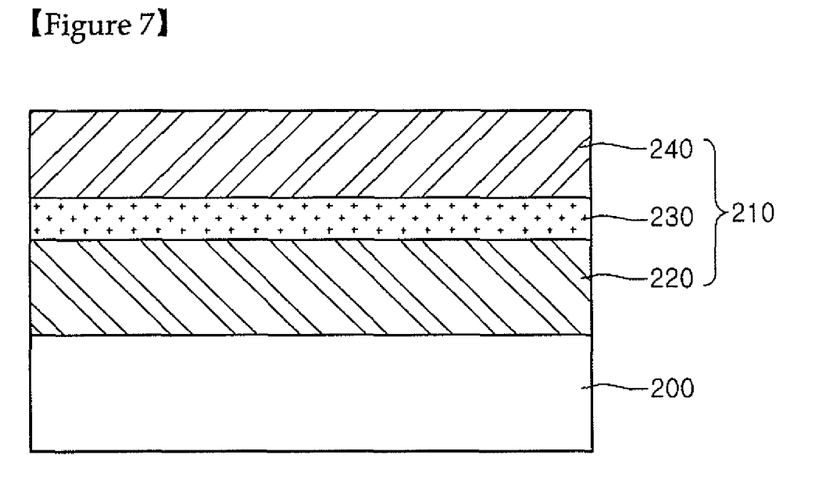
FIG. 7 illustrates the manufacturing process of a nitride semiconductor device according to another embodiment of the invention.

Referring to FIG. 7, a light emitting structure 210 is formed on a support substrate 200. The support substrate 200 may be any one of an $Al_2O_3$ substrate, a Si substrate, a SiC substrate, an $Al_2O_3$ substrate including a GaN on an upper part thereof, a Si substrate including a GaN on an upper part thereof, and a SiC substrate including a GaN on an upper part thereof.

The light emitting structure 210 may be formed by epitaxially growing a GaN buffer layer (not shown) to a thickness of about 2 to 3 μm on the support substrate 200 and then depositing a first semiconductor layer 220, an active layer 230, and a second semiconductor layer 240. Alternatively, the light emitting structure 210 may be structured in a manner that the second semiconductor layer 240, the active layer 230, and the first semiconductor layer 220 are deposited on the support substrate 200.

The first semiconductor layer 220 may be an n-type GaN layer disposed on the support substrate 200. The active layer 230 may be disposed on the first semiconductor layer 220, having a GaN-based single quantum well (SQW) structure or a multi quantum well (MQW) structure. Also, the active layer 230 may have a quantum structure in the form of a supper lattice of the above structures. The quantum structures of the active layer 230 may be constructed by combining various GaN-based materials such as AlInGaN and InGaN.

The second semiconductor layer 240 may be a p-type GaN layer disposed on the active layer 230. The light emitting structure 210 generates light in the active layer through combination of electrons and holes, thereby functioning as a light emitting device. Especially, the light emitting device having a vertical electrode structure is achieved by removing the support substrate 200, accordingly improving the electrical efficiency.

Figure 8:
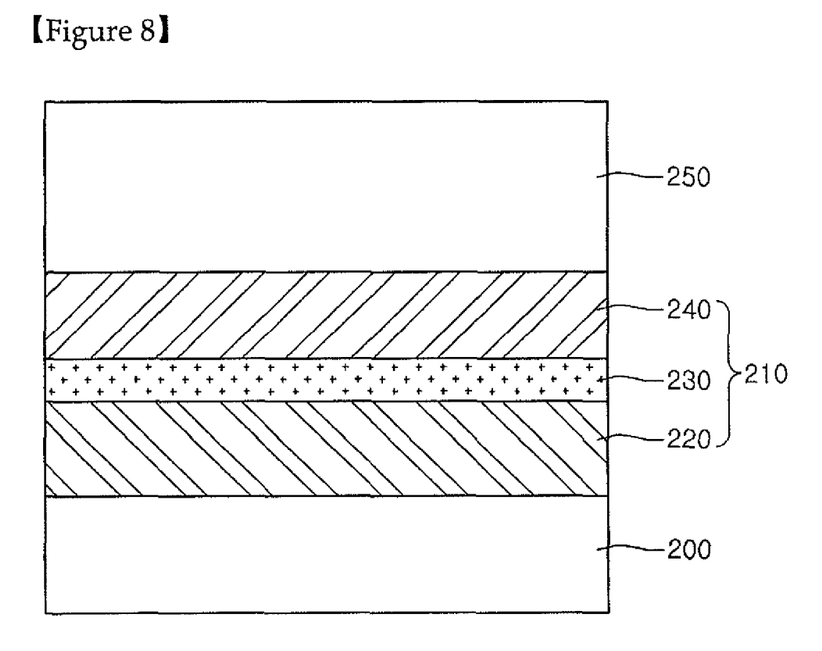
FIG. 8 illustrates the manufacturing process of a nitride semiconductor device according to another embodiment of the invention and that of FIG. 7.

Referring to FIG. 8, a second conductive layer 250 is formed on the second semiconductor layer 240. The second conductive layer 250 may have a sufficient thickness to support the light emitting structure 210. For example, the second conductive layer 250 may have a thickness of about 50 to 100 μm. The second conductive layer 250 may be made of a conductive material. For example, the second conductive layer 250 may be formed by electro-plating of any one of Cu, Au, Ni, and Al, or may be an alloy of them. The second conductive layer 250 may function as an electrode of the second semiconductor layer 240. That is, the second conductive layer 250 may be a p-type electrode or an n-type electrode according to positions of the first and the second semiconductor layers 220 and 240.

Figure 9:
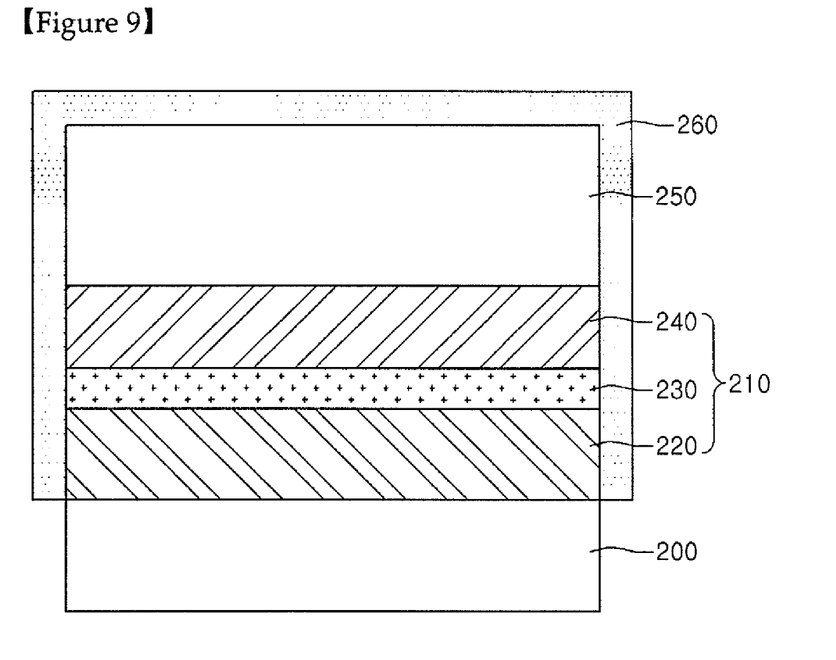
FIG. 9 illustrates the manufacturing process of a nitride semiconductor device according to another embodiment of the invention and that of FIGS. 7-8.

Referring to FIG. 9, a passivation layer 260 is formed on surfaces of the second conductive layer 250 and the light emitting structure 210. The passivation layer 260 is adapted to protect the second conductive layer 250 and the light emitting structure 210 during removal of the support substrate 200. The passivation layer 260 may be disposed in a region except for the support 100. In other words, the passivation layer 260 may be disposed selectively on exposed surfaces of the light emitting structure 210, that is, a side surface and an upper surface of the second conductive layer 250. For example, the passivation layer 260 may be formed of at least one of enamel, Teflon, paraffin, and polyester.

The passivation layer 260 may be selectively disposed only on the exposed region of the second conductive layer 250 and the light emitting structure 210 by spin coating or brush coating. Next, the passivation layer 260 is increased in the density by undergoing a curing process, so as to be able to protect the second conductive layer 250 and the light emitting structure 210. For example, the curing process may be a low-temperature heat treatment or a drying process.

Figure 10:
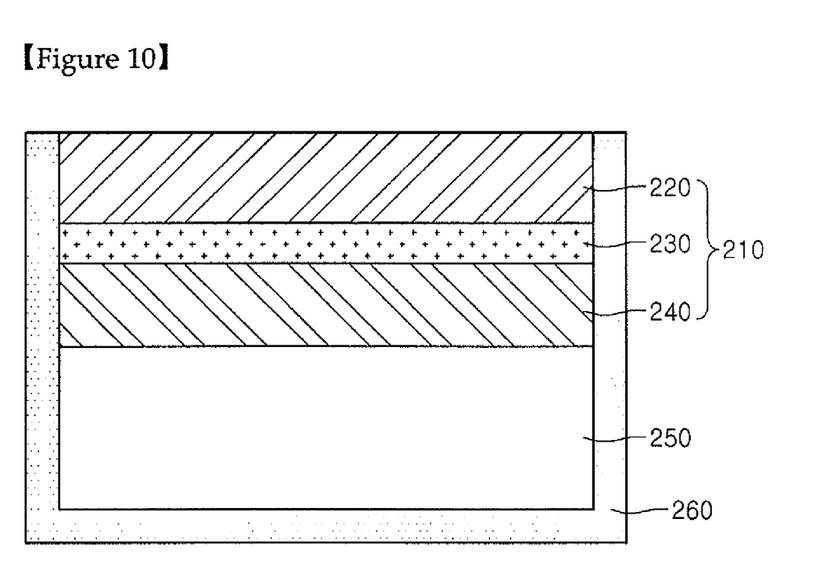
FIG. 10 illustrates the manufacturing process of a nitride semiconductor device according to another embodiment of the invention and that of FIGS. 7-9.

Referring to FIG. 10, the support substrate 200 is removed such that one surface of the light emitting structure 210 is exposed. The support substrate 200 may be selectively removed by an etching process that uses the passivation layer 260 as an etching mask. The etching process may be wet etching using a chemical agent which selectively removes the support substrate 200. Since the passivation layer 260 is used as an etching mask, selective removal of the support substrate 200 can be performed without damaging the light emitting structure 210 and the second conductive layer 250. As the support substrate 200 is removed, one surface of the first semiconductor layer 220 that has been in contact with the support substrate 200 is exposed. Thus, since the support substrate 200 is quickly removed through the wet etching, the processing time may be reduced. Therefore, in comparison to a general laser process, economic efficiency can be improved while damage of the light emitting structure 210 is reduced. Consequently, reliability of the device is improved.

After the support substrate 200 is removed, the whole structure may be turned by about 180 degrees such that the second conductive layer 250 is disposed at a lower part of the light emitting structure 210. Alternatively, the support substrate 200, the light emitting structure 210, and the second conductive layer 250 may be turned by about 180 degrees before the support substrate 200 is removed, and the etching process may be performed next.

Figure 11:
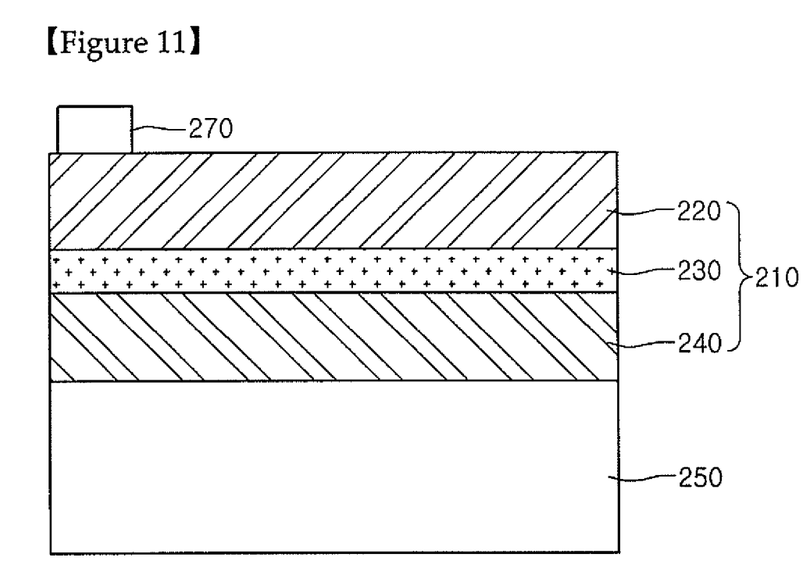
FIG. 11 illustrates the manufacturing process of a nitride semiconductor device according to another embodiment of the invention and that of FIGS. 7-10.

Referring to FIG. 11, the passivation layer 260 is removed such that the light emitting structure 210 has a vertical structure. Here, the passivation layer 260 may be removed by a coating removal process. For example, the passivation layer 260 may be removed by using an alcohol solvent such as methanol, acetone, and IPA.

The second conductive layer 250 and the light emitting structure 210 are exposed as the passivation layer 260 is removed. As a result, the light emitting structure 210 has a vertical structure in which the second semiconductor layer 240, the active layer 230, and the first semiconductor layer 220 are deposited. Here, the second conductive layer 250 may function as an electrode of the second semiconductor layer 240. Additionally, a first conductive layer 270 may be selectively formed on an exposed surface of the first semiconductor layer 220. The first conductive layer 270 may be an n-type electrode.

As described above, the support substrate 200 is separated from the light emitting structure 210 by the coating layer. Therefore, damage to the light emitting structure 210 and loss of light intensity may be minimized. Since the support substrate 200 is removed by the wet etching after manufacturing of the light emitting structure 210, a mass process can be performed. As a result, economical efficiency is improved. Furthermore, the efficiency of the device is improved by the second conductive layer 250 serving not only as the support substrate 200 of the light emitting structure 210 but also as an electrode.

Features, structures, and effects described in the above embodiments are incorporated into at least one embodiment of the present invention, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention. Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

According to the embodiment, a high quality gallium nitride (GaN) layer may be obtained. For example, a GaN epitaxial layer and a support part may be formed on a hybrid substrate and then protected by a coating layer so that the hybrid substrate can be selectively removed. However, the present invention is not limited to the above embodiment.

What is claimed is:

1. A method of manufacturing a nitride semiconductor device, the method comprising:
   forming a gallium nitride (GaN) epitaxial layer on a first support substrate;
   forming a second support substrate on the GaN epitaxial layer;
   forming a passivation layer on a surface of another region of the GaN epitaxial layer except for the first support substrate;
   etching the first support substrate by using the passivation layer as a mask; and
   removing the passivation layer and thereby exposing the second support substrate and the GaN epitaxial layer.

2. The method of claim 1, wherein the passivation layer is made of at least one of liquid enamel, Teflon, paraffin, and polyester.

3. The method of claim 1, further comprising performing a curing process after formation of the passivation layer.

4. The method of claim 1, wherein the first support substrate comprises any one of an oxide substrate, a carbide substrate, and a silicon substrate.

5. The method of claim 1, wherein the first support substrate is selectively etched by a wet etching process.

6. The method of claim 1, wherein the passivation layer is removed by an alcohol solvent.

7. The method of claim 1, further comprising forming a single crystalline GaN layer on an exposed surface of the GaN epitaxial layer after the passivation layer is removed.

8. The method of claim 1, wherein the second support substrate is made of the same material as the first support substrate or of a conductive material comprising metal.

9. A method of manufacturing a nitride semiconductor device, the method comprising:
   forming a light emitting structure on a support substrate;
   forming a second conductive layer on the light emitting structure;
   forming a passivation layer on surfaces of the light emitting structure and the second conductive layer except for a region of the support substrate;
   etching the support substrate by using the passivation layer as an etching mask such that one surface of the light emitting structure is exposed; and
   removing the passivation layer.

10. The method of claim 9, wherein forming of the light emitting structure includes:
    forming a buffer layer on the support substrate;
    forming a first conductive GaN layer on the buffer layer;
    forming an active layer on the first conductive GaN layer; and
    forming a second conductive GaN layer on the active layer.

11. The method of claim 9, wherein the support substrate is selectively removed by a wet etching process.

12. The method of claim 9, wherein the passivation layer is formed by spin coating or brush coating using at least one of liquid enamel, Teflon, paraffin and polyester.

13. The method of claim 9, wherein the passivation layer is removed by an alcohol solvent comprising at least one of methanol, acetone, and isopropyl alcohol (IPA).

14. The method of claim 9, further comprising forming a first conductive layer on the exposed surface of the light emitting structure after the passivation layer is removed.

* * * * *